United States Patent
Takahashi et al.

(10) Patent No.: US 7,860,585 B2
(45) Date of Patent: Dec. 28, 2010

(54) HEAT PROCESSING APPARATUS, METHOD OF AUTOMATICALLY TUNING CONTROL CONSTANTS, AND STORAGE MEDIUM

(75) Inventors: Goro Takahashi, Oshu (JP); Hisashi Inoue, Fuchu (JP); Shoichi Kanda, Oshu (JP); Wenling Wang, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 409 days.

(21) Appl. No.: 12/081,211

(22) Filed: Apr. 11, 2008

(65) Prior Publication Data
US 2008/0255683 A1 Oct. 16, 2008

(30) Foreign Application Priority Data
Apr. 13, 2007 (JP) ............................. 2007-106247

(51) Int. Cl.
G05D 23/00 (2006.01)
G05B 13/02 (2006.01)
H05B 1/02 (2006.01)

(52) U.S. Cl. ........................ 700/42; 700/37; 700/300; 219/494

(58) Field of Classification Search ................ 700/19, 700/28, 31, 37, 42, 275, 276, 277, 278, 299, 700/300; 219/412, 413, 446.1, 448.11, 448.12, 219/476, 480, 483, 490, 494
See application file for complete search history.

(56) References Cited

U.S. PATENT DOCUMENTS 6,496,749 B1   12/2002   Yamaguchi et al.
6,951,998 B2 * 10/2005   Nanno et al. ................ 700/300
7,218,999 B2 *  5/2007   Matsunaga et al. .......... 700/300
7,324,877 B2 *  1/2008   Tanaka et al. ................ 700/300
7,346,273 B2 *  3/2008   Tanaka et al. ................ 219/483
7,577,493 B2 *  8/2009   Sugishita et al. ............ 219/494

FOREIGN PATENT DOCUMENTS

| JP | 56-153404 | 11/1981 |
| JP | 62-143103 | 6/1987 |
| JP | 5-143113 | 6/1993 |
| JP | 2000-183072 | 6/2000 |

OTHER PUBLICATIONS

Japanese Office Action issued on Apr. 7, 2009 for Japanese Patent Application No. 2007-106247 with English translation.

* cited by examiner

*Primary Examiner*—Charles R Kasenge
(74) *Attorney, Agent, or Firm*—Smith, Gambrell & Russell, LLP

(57) ABSTRACT

A heat processing apparatus includes a reaction vessel, a heating unit in the reaction vessel to heat the processing region, a temperature detector that detects temperature in the processing region, and a control part to control the heating unit by PID control. The control part has a rule table, and a performance unit that obtains temperature profiles and calculates differences between actually measured temperatures and target values. It refers to the rule table change the PID constants. The control part also updates relationships between PID constants and predicted temperature change amounts.

21 Claims, 15 Drawing Sheets

(a)

| OVERSHOOT | | | | |
|---|---|---|---|---|
| TEMPERATURE BAND | VARIATION AMOUNT | P | I | D |
| 400°C | 0 | 1 | 1 | 1 |
| | 1.5 | 1 | 0.65 | 1 |
| | 3.0 | 1 | 0.55 | 1 |
| 500°C | | | | |

(b)

| UNDERSHOOT | | | | |
|---|---|---|---|---|
| TEMPERATURE BAND | VARIATION AMOUNT | P | I | D |
| 400°C | 0 | 1 | 1 | 1 |
| | 1.5 | 1 | 0.85 | 0.9 |
| | 3.0 | 1 | 0.8 | 1 |
| 500°C | | | | |

(c)

| RECOVERY | | | | |
|---|---|---|---|---|
| TEMPERATURE BAND | VARIATION AMOUNT | P | I | D |
| 400°C | 0 | 1 | 1 | 1 |
| | 1.5 | 0.92 | 1 | 1 |
| | 3.0 | 0.9 | 1 | 1 |
| 500°C | | | | |

FIG. 4

| OVERSHOOT | | | | |
|---|---|---|---|---|
| TEMPERATURE BAND | VARIATION AMOUNT | P | I | D |
| 400°C | 0 | 1 | 1 | 1 |
| | 1.5 | 1 | 0.65 | 1 |
| | 3.0 | 1 | 0.55 | 1 |

⇩

| OVERSHOOT | | | | |
|---|---|---|---|---|
| TEMPERATURE BAND | VARIATION AMOUNT | P | I | D |
| 400°C | 0 | 1 | 1 | 1 |
| | 1.5 | 1 | 0.65 | 1 |
| | 2.0 | 1 | 0.55 | 1 |

FIG. 8

(a) CHANGE RATIO OF SECOND RUN
| | OVERSHOOT | | | |
|---|---|---|---|---|
| TEMPERATURE BAND | VARIATION AMOUNT | P | I | D |
| 400°C | 0 | 1 | 1 | 1 |
| | 1.5 | 1 | 0.65 | 1 |
| | 3.0 | 1 | 0.55 | 1 |
(+1.5)　　　　(Δ0.1)
(b)
| | OVERSHOOT | | | |
|---|---|---|---|---|
| TEMPERATURE BAND | VARIATION AMOUNT | P | I | D |
| 400°C | 0 | 1 | 1 | 1 |
| | 1.0 | 1 | 0.55 | 1 |
| | 3.0 | 1 | 0.55 | 1 |
+2.0
(c) CHANGE RATIO OF THIRD RUN
| | OVERSHOOT | | | |
|---|---|---|---|---|
| TEMPERATURE BAND | VARIATION AMOUNT | P | I | D |
| 400°C | 0 | 1 | 1 | 1 |
| | 1.0 | 1 | 0.55 | 1 |
| | 3.0 | 1 | 0.42 | 1 |
+2.0　　$\left(\Delta \frac{0.1}{1.5} \times 2.0 = \Delta 0.13\right)$
FIG. 9

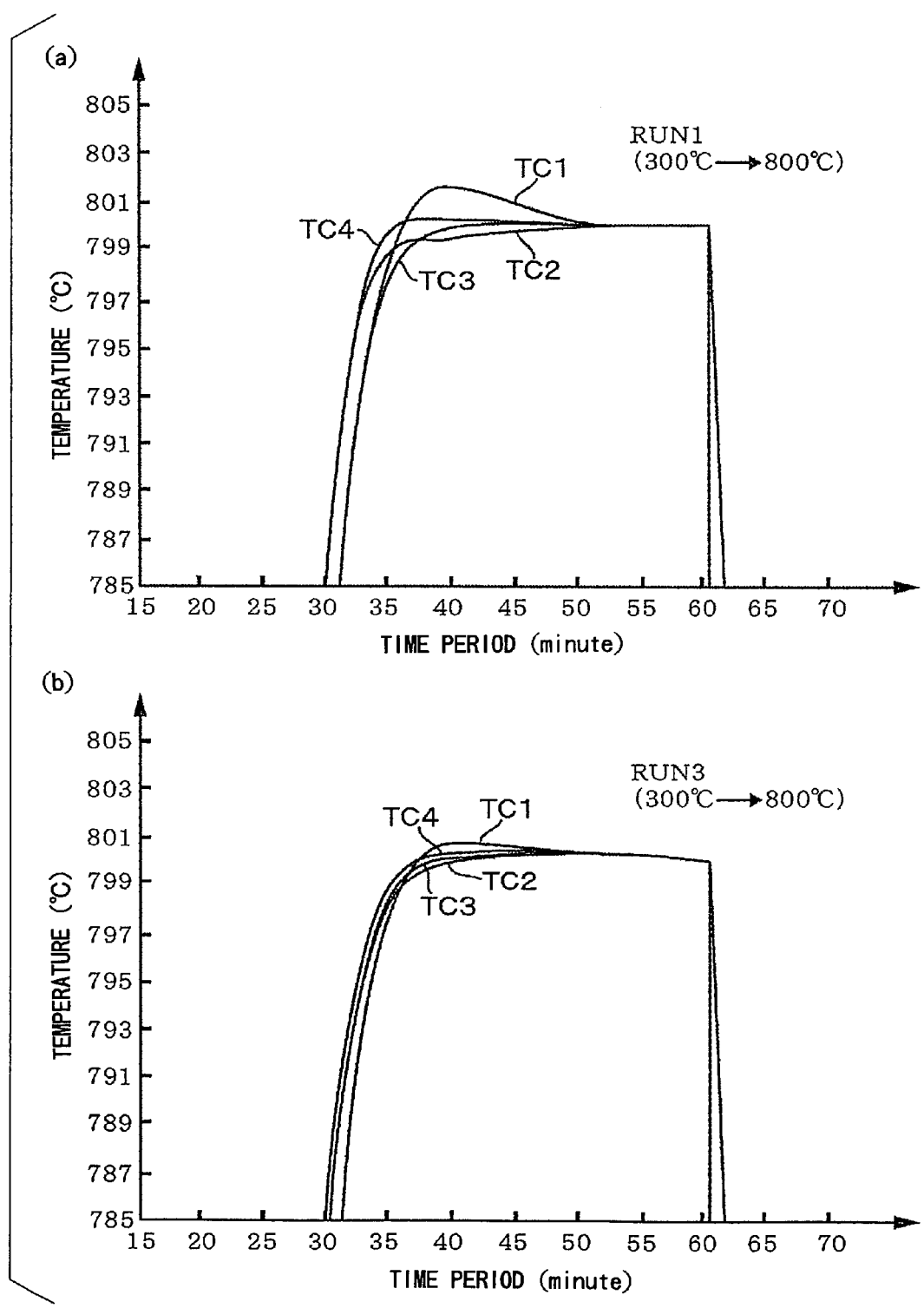
F I G . 1 3

HEAT PROCESSING APPARATUS, METHOD OF AUTOMATICALLY TUNING CONTROL CONSTANTS, AND STORAGE MEDIUM

CROSS REFERENCE TO RELATED APPLICATIONS

This application is based upon and claims the benefit of priority from the prior Japanese Patent Application No. 2007-106247 filed on Apr. 13, 2007, the entire contents of which are incorporated herein by reference.

FIELD OF THE INVENTION

The present invention relates to, in an apparatus that thermally processes an object to be processed while controlling a temperature by a P (proportional element) I (Integral element) D (Derivative element) control, a technique for automatically tuning PID constants.

DESCRIPTION OF RELATED ART

There are heat processing apparatuses of a batch type and a wafer-fed type, among semiconductor manufacturing apparatuses. In these heat processing apparatuses, a processing region is divided into a plurality of zones, and a temperature in each zone is independently controlled. In a vertical heat processing apparatus, for example, an inside of a vertical reaction vessel is vertically divided into a plurality of zones, and a heater and a temperature controller are disposed in each zone. As temperature detectors, there are interior temperature detectors disposed inside the reaction vessel, an exterior temperature detector disposed outside the reaction vessel, or a temperature detector for profile disposed near a substrate. By using these detectors, a predetermined combination of temperature properties are provided. In this case, a PID control is generally performed, while there are required various temperature property results depending on heaters disposed in the respective zones, objects to be tuned (types of temperature detectors), and recipes (including setting patterns for temperature-increasing steps). Thus, optimum PID constants have to be used in accordance with a required result.

There has been known a method of tuning PID constants in which a certain power is input to a heater in a stepped manner, an output thereof is obtained from, e.g., an interior temperature detector, and PID constants are calculated from a transfer function, a frequency, and an amplitude at this time. The thus calculated PID constants have been applied to all the recipes. Although there are, as algorithms for this calculation, a critical sensitivity method, a fuzzy, and an application of model, they have following disadvantages.

In a case where the critical sensitivity method or the application of model is applied to heaters in different zones, there is a possibility that an auto-tuning cannot be properly performed because of a large interference between the respective heaters. Further, it is difficult to apply the critical sensitivity method and the application of model to a cascade control. In a case of the fuzzy or the application of model, it is necessary to change models or coefficients of a performance function, when a hard structure and/or a recipe to be tuned are changed. In this case, a considerable developing process is needed therefore. Furthermore, the conventional methods cannot provide optimum PID constants in accordance with a recipe, and cannot tune temperature properties of different temperature control zones. Moreover, when a temperature is increased up to a target value, which parameter out of an overshoot, an undershoot, a recovery period, and a temperature difference between the zones is selected and how to improve the parameter may differ from a user's need. In addition thereto, when a hard structure is changed, a tuning precision may be deteriorated. Therefore, there are actually a lot of points to be studied when performing an auto-tuning.

Claims of JP 56-153404A discloses a method including the steps of: roughly setting PID constants at first, disturbing a process to obtain a measured value of controllability, and changing the PID constants based on the measured value, so that the PID constants are automatically tuned by sequentially repeating these steps. However, since this method changes the PID constants depending on improvement or deterioration of controllability, it is difficult to converge each PID constant into a proper value. Even if the PID constant can be converged into a proper value, there are needed a number of trial steps before such a convergence.

SUMMARY OF THE INVENTION

The present invention has been made in view of the above circumstances. The object of the present invention is to provide, in an apparatus that thermally processes an object to be processed while controlling a temperature by a PID control, a technique for tuning PID constants in a reliable and easy manner.

A heat processing apparatus according to the present invention is a heat processing apparatus comprising: a reaction vessel configured to contain a processing region and an object to be processed; a heating unit disposed in the reaction vessel and configured to heat the processing region; a temperature detection part configured to detect a temperature of the processing region that is heated by the heating unit; and a control part configured to control the heating unit by a PID control; wherein the control part includes: a rule table that is prepared such that predicted change amounts of a temperature property item when a temperature of the processing region is increased up to a target value, and change ratios of PID constants are correspondingly related to each other; a performance unit configured to repeatedly perform: a step of, after setting the PID constants, obtaining a temperature profile based on a temperature detected value of the temperature detection part, while increasing the temperature of the processing region up to a target temperature by the heating unit, and calculating a difference between an actually measured value and a target value of the temperature property item based on the temperature profile; and a step of, when the difference is over an allowable range and larger than a prescribed value, referring to the rule table and changing the PID constants to reset new PID constants by a change ratio corresponding to an predicted change amount of the temperature property item relative to the difference; until the difference can fall within the allowable range; and an updating unit configured to update, when there is a difference between an actually measured change amount of the temperature property item that has been changed by changing the PID constants with reference to the rule table and an predicted change amount of the temperature property item that has been predicted in the preceding cycle, the corresponding relationship between the PID constants and the predicted change amounts of the temperature property item described in the rule table, based on the actually measured change amount.

In the heat processing apparatus according to the present invention, it is preferable that the temperature property item includes a plurality of temperature property items, and that the temperature property items are prioritized for a case in which the change ratios of the PID constants corresponding to the predicted change amounts of the respective temperature property items conflict with each other.

In the heat processing apparatus according to the present invention, it is preferable that the temperature property item is at least one of an overshoot that is a maximum difference between the temperature detected value of the temperature detection part exceeding the target temperature and the target temperature, an undershoot that is a maximum declining amount from the target temperature after the temperature detected value goes beyond the target temperature and then falls below the target temperature, and a temperature stability period that is a period from when the temperature increase is started until the temperature detected value converges with a predetermined temperature range.

In the heat processing apparatus according to the present invention, it is preferable that, when the difference between the actually measured value and the target value of the temperature property item is over the allowable range and is smaller than the prescribed value, the performance unit changes the PID constants without using the rule table.

In the heat processing apparatus according to the present invention, it is preferable that the temperature property item includes a plurality of temperature property items, and that in a case in which the temperature property item that has been over the target value does not vary between the preceding cycle and the current cycle, when the performance unit changes the PID constants without using the rule table, the performance unit changes the PID constants having an effect on this temperature property item by a preset change ratio.

In the heat processing apparatus according to the present invention, it is preferable that the temperature property item includes a plurality of temperature property items, and that in a case in which the temperature property item that has been over the target value varies between the preceding cycle and the current, when the performance unit changes the PID constants without using the rule table, the performance unit uses an average value of the PID constants used in the preceding cycle and the current cycle as newly changed PID constants.

In the heat processing apparatus according to the present invention, it is preferable that the reaction vessel is divided into a plurality of divided regions, that the heating unit includes a plurality of heating units that are respectively disposed on the divided regions, and that each of the heating units is independently PID-controlled by the control part.

In the heat processing apparatus according to the present invention, it is preferable that, after the differences between the actually measured values of the temperature property items and the target values calculated based on temperature profiles corresponding to the respective divided regions fall within the allowable ranges, the performance unit judges whether the temperature profiles corresponding to the respective divided regions conform to each other or not, and if not, the performance unit tunes the PID constants corresponding to at least one divided region out of the plurality of divided regions based on a predetermined rule.

In the heat processing apparatus according to the present invention, it is preferable that the temperature property item of the rule table includes a temperature stability period that is a period from when the temperature increase is started until the temperature detected value converges with a predetermined temperature range, and that, when the temperature profiles corresponding to the respective divided regions do not conform to each other, the performance unit tunes the PID constants corresponding to another divided region such that the temperature stability periods of the other divided region conforms to the temperature stability period of one divided region.

In the heat processing apparatus according to the present invention, it is preferable that the performance unit calculates a periodical difference between the temperature stability periods of the other divided region and the temperature stability period of the one divided region, and changes the PID constants to reset new PID constants for the other divided regions, with reference to the rule table, by a change ratio corresponding to an predicted change amount of the temperature stability period relative to the calculated periodical difference, and that the updating unit updates the rule table based on the changed PID constants.

A method of automatically tuning a control constant according to the present invention is an auto-tuning method of control constants, comprising: a step of positioning an object to be processed in a processing region; a step of thermally processing the object to be processed by a heating unit; a step of controlling a temperature of the heating unit by a PID control; a step (a) of detecting a temperature of the processing region that is heated by the heating unit; a step (b) of repeating: a step (b1) of, after setting PID constants, obtaining a temperature profile based on a temperature detected value of a heat detection part, while increasing a temperature of the processing region up to a target temperature by the heating unit, and calculating a difference between an actually measured value and a target value based on the temperature profile; and a step (b2) of, when the difference is over an allowable range and larger than a prescribed value, referring to a rule table that is prepared such that predicted change amounts of a temperature property item when the temperature of the processing region is increased up to a target value, and change ratios of the PID constants are correspondingly related to each other, and changing the PID constants to reset new PID constants by a change ratio corresponding to an predicted change amount of the temperature property item relative to the difference; until the difference can fall within the allowable range; and a step (c) of updating with reference to the rule table, when there is a difference between an actually measured change amount of the temperature property item that has been changed by the change of the PID constants and an predicted change amount of the temperature property item that has been predicted in the preceding cycle, the corresponding relationship between the PID constants and the predicted change amounts of the temperature property item described in the rule table, based on the actually measured change amount.

In the method of automatically tuning a control constant according to the present invention, it is preferable that the temperature property item includes a plurality of temperature property items that are prioritized, and that, when change ratios of the PID constants corresponding to predicted change amounts of the respective temperature property items conflict with each other, decision of which one of the temperature property items is preferentially tuned is made based on the prioritized order.

In the method of automatically tuning a control constant according to the present invention, it is preferable that at least one of an overshoot that is a maximum difference between the temperature detected value of the temperature detection part exceeding the target temperature and the target temperature, an undershoot that is a maximum declining amount from the target temperature after the temperature detected value goes beyond the target temperature and then falls below the target temperature, and a temperature stability period that is a period from when the temperature increase is started until the temperature detected value converges with a predetermined temperature range, is used as the temperature property item.

In the method of automatically tuning a control constant according to the present invention, it is preferable that the step (b2) includes a step of changing the PID constants without using the rule table, when the difference between the actually measured value and the target value of the temperature property item is over the allowable range and is smaller than the prescribed value.

In the method of automatically tuning a control constant according to the present invention, it is preferable that the temperature property item includes a plurality of temperature property items, and that the step of changing the PID constants without using the rule table changes, when the temperature property item that has been over the target value does not vary between the preceding cycle and the current cycle, the PID constants having an effect on this temperature property item by a preset change ratio.

In the method of automatically tuning a control constant according to the present invention, it is preferable that the temperature property item includes a plurality of temperature property items, and that the step of changing the PID constants without using the rule table uses, when the temperature property item that has been over the target value varies between the preceding cycle and the current cycle, an average value of the PID constants in the preceding cycle and the current cycle as newly changed PID constants.

In the method of automatically tuning a control constant according to the present invention, it is preferable that a reaction vessel is divided into a plurality of divided regions, and the heating unit includes a plurality of heating units that are respectively disposed on the divided regions, and that each of the heating units is independently PID-controlled.

In the method of automatically tuning a control constant according to the present invention, it is preferable that, after the differences between the actually measured values of the temperature property items and the target values calculated based on temperature profiles corresponding to the respective divided regions fall within the allowable ranges, the step (b) judges whether the temperature profiles corresponding to the respective divided regions conform to each other or not, and if not, tunes the PDI constants at least one divided region out of the plurality of divided regions based on a predetermined rule.

In the method of automatically tuning a control constant according to the present invention, it is preferable that the temperature property item of the rule table includes a temperature stability period that is a period from when the temperature increase is started until the temperature detected value converges with a predetermined temperature range, and that, when the temperature profiles corresponding to the respective divided regions do not conform to each other, the PID constants corresponding to another divided region such that the temperature stability periods of the other divided region conforms to the temperature stability period of one divided region.

In the method of automatically tuning a control constant according to the present invention, it is preferable that a periodical difference between the temperature stability periods of the other divided region and the temperature stability period of the one divided region is calculated, and the PID constants for the other divided regions are changed to be reset as new PID constants, with reference to the rule table, by a change ratio corresponding to an predicted change amount of the temperature stability period relative to the calculated periodical difference, and that the rule table is updated based on the changed PID constants by an updating unit.

A storage medium according to the present invention is a storage medium storing a computer program for causing a computer to perform an auto-tuning method of control constants, wherein the auto-tuning method of control constants comprises: a step of positioning an object to be processed in a processing region; a step of thermally processing the object to be processed by a heating unit; a step of controlling a temperature of the heating unit by a PID control; a step (a) of detecting a temperature of the processing region that is heated by the heating unit; a step (b) of repeating: a step (b1) of, after setting PID constants, obtaining a temperature profile based on a temperature detected value of a heat detection part, while increasing a temperature of the processing region up to a target temperature by the heating unit, and calculating a difference between an actually measured value and a target value based on the temperature profile; and a step (b2) of, when the difference is over an allowable range and larger than a prescribed value, referring to a rule table that is prepared such that predicted change amounts of a temperature property item when the temperature of the processing region is increased up to a target value, and change ratios of the PID constants are correspondingly related to each other, and changing the PID constants to reset new PID constants by a change ratio corresponding to an predicted change amount of the temperature property item relative to the difference; until the difference can fall within the allowable range; and a step (c) of updating with reference to the rule table, when there is a difference between an actually measured change amount of the temperature property item that has been changed by the change of the PID constants and an predicted change amount of the temperature property item that has been predicted in the preceding cycle, the corresponding relationship between the PID constants and the predicted change amounts of the temperature property item described in the rule table, based on the actually measured change amount.

BRIEF DESCRIPTION OF THE DRAWINGS

FIGS. 4(a) to 4(c) are explanatory views showing rule tables for overshoot, undershoot, and recovery.

FIG. 8 is an explanatory view showing an updating example of the rule table for overshoot.

FIGS. 9(a) to 9(c) are second explanatory views showing an updating example of the rule table for overshoot.

FIGS. 13(a) and 13(b) are explanatory views showing a temperature profile before and after performance of the tuning of the present invention.

DESCRIPTION OF PREFERRED EMBODIMENT OF THE INVENTION

Figure 1:
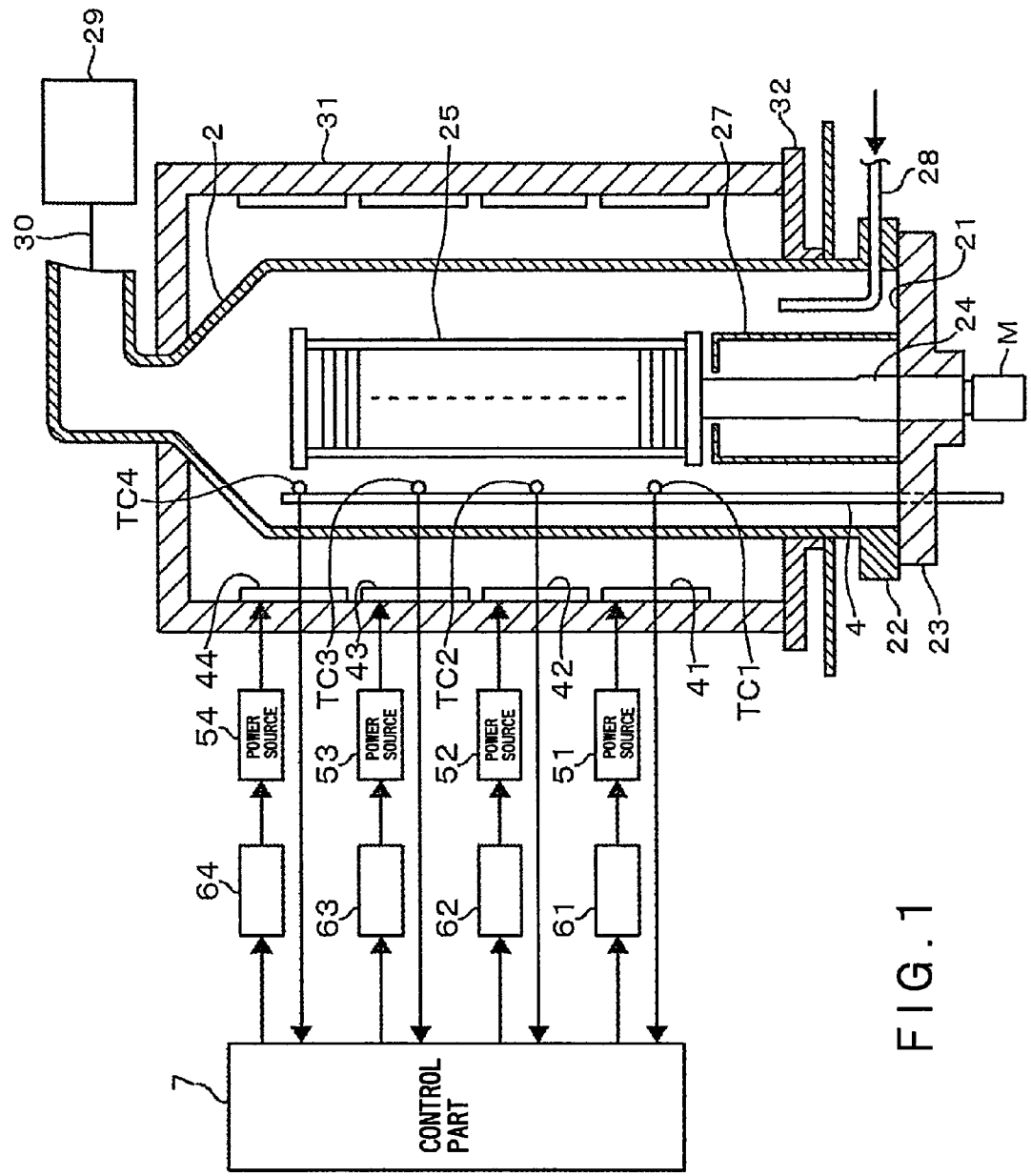
FIG. 1 is a longitudinal side view showing a vertical heat processing apparatus in one embodiment of the present invention.

FIG. 1 is an overall structural view of a vertical heat processing apparatus in one embodiment to which the present invention is applied. The overall structure of the vertical heat processing apparatus is briefly described in the first place. The reference number 2 in FIG. 1 depicts a reaction vessel made of quartz having a vertically cylindrical shape. A lower end of the processing vessel 2 is opened as a loading/unloading port (furnace opening) to define an opening 21. A flange 22 is integrally formed with a periphery of the opening 21. Arranged below the reaction vessel 2 is a lid member 23 made of quartz. The lid member 23 is configured to be brought into contact with a lower surface of the flange 22 so as to hermetically close the opening 21. A rotational shaft 24 is disposed to pass through a center part of the lid member 23. A wafer boat 25 serving as a substrate holder is placed on an upper end of the rotational shaft 24. The wafer boat 25 is configured to hold a number of wafers W as substrates in a tier-like manner. A motor M as a driving part for rotating the rotational shaft 24 is disposed on a lower part of the rotational shaft 24. Placed on the lid member 23 is a temperature-retention unit 27 that surrounds the rotational shaft 24.

An L-shaped injector 28 for supplying a gas to wafers W in the reaction vessel 2 is inserted through the flange 22 on a lower part of the reaction vessel 2. Thus, a gas required for film deposition can be supplied into the reaction vessel 2 through the injector 28. An exhaust port for exhausting an inside of the reaction vessel 2 is formed in an upper part of the reaction vessel 2. Connected to the exhaust port is an exhaust pipe 30 provided with a vacuum pump 29 which functions as a vacuum exhaust unit capable of evacuating the inside of the reaction vessel 2 and decreasing a pressure therein to a desired vacuum degree.

Around the reaction vessel 2, a cylindrical heat-insulation layer 31 is fixed on a base member 32. For example, vertically divided heaters each formed of a heating resistor serving as a heating unit are disposed on an inside of the heat-insulation layer 31. In this example, the number of the divided heaters is, e.g., four, and the reference numbers 41 to 44 are allocated to the heaters from the first stage to the fourth stage, respectively. A processing region for thermally processing wafers is vertically divided into four zones (uppermost zone, upper zone, lower zone, lowermost zone) for a heat control. These heaters 41 to 44 are configured to respectively take charge of heating of the four zones (divided regions).

Interior temperature sensors TC1 to TC4, which correspond to interior temperature detectors and are formed of, e.g., thermocouples, are disposed in the reaction vessel 2 at height positions corresponding to the respective heaters 41 to 44. These interior temperature sensors TC1 to TC4 are attached to a rod 4 fixed on the lid member 23, for example. There are disposed power source parts (power supply parts) 51 to 54 corresponding to the heaters 41 to 44, respectively.

Figure 2:
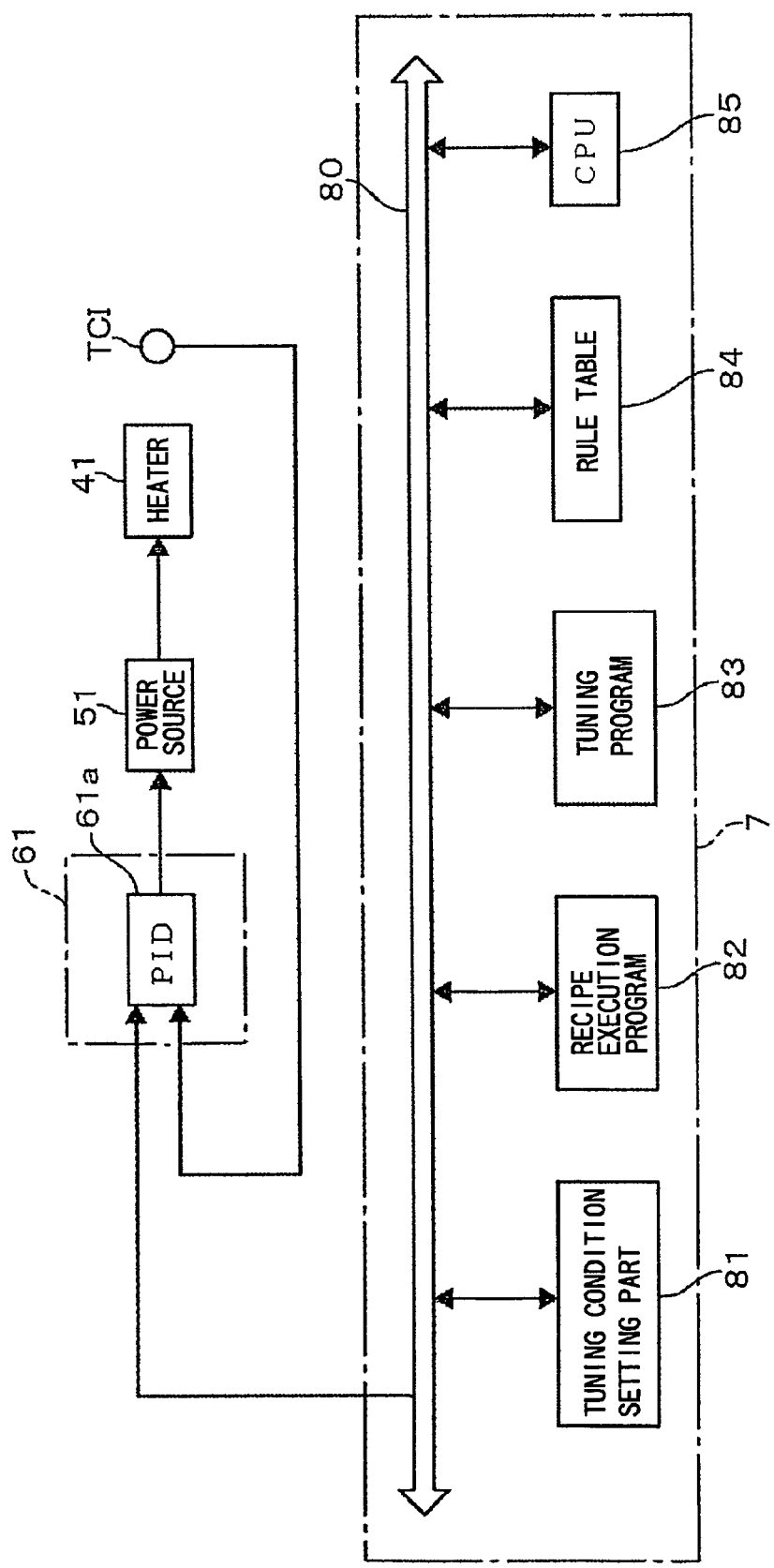
FIG. 2 is a block diagram showing a control part used in the embodiment of the present invention.

The vertical heat processing apparatus includes: four temperature controllers 61 to 64 for controlling temperatures of the four zones, which are disposed correspondingly to the power source parts 51 to 54 for the heaters of the respective stages; and a control part 7 for performing the below-described control operations such as setting of temperature values of the temperature controllers 61 to 64 and setting of PID. The temperature controllers 61 to 64 calculate deviation between temperature setting values of the zones heated by the respective heaters 41 to 44 and temperature detected values detected by the interior temperature sensors TC1 to TC4 by a PID calculation part 61, which is described hereafter, and give power command values for the respective heaters 41 to 44 to the power source parts 51 to 54 (see, FIG. 2). Next, the control part 7 is described in detail with reference to FIG. 2. In FIG. 2, the reference number 80 depicts a bus. The bus 80 is composed of a tuning condition setting part 81, a recipe execution program 82, a tuning program 83, a rule table 84, a CPU 85, and so on. The control part 7 constituting a computer is connected to the bus 80. FIG. 2 schematically illustrates these members as blocks. The recipe execution program 82 and the tuning program 83, which are stored in a storage medium such as a hard disc, a compact disc, a magnet optical disc, or memory card, are installed from the storage medium to the computer.

The recipe execution program 82 is a program for executing a recipe selected from a plurality of recipes that are prepared beforehand. A recipe includes information relating to processing parameters (temperature, pressure, type of gas, gas flow rate) for each period. The program reads out the information and sequentially controls control members.

The tuning condition setting part 81 carries out a function for receiving various tuning condition settings through a soft switch from, e.g., a control system administrator of the vertical heat processing apparatus. In the tuning condition setting part 81, there are set conditions for, e.g., an object to be tuned, a tuning control mode, a target value of each temperature property item, and these temperature property items are prioritized.

Objects to be tuned by the tuning condition setting part 81 are the four interior temperature sensors TC1 to TC4 disposed in the reaction vessel 2 to correspond to the heaters 41 to 44 of the respective stages for the four divided zones. The tuning condition setting part 81 can select whether to perform the tuning of PID constants or not, with respect to the temperature controllers 61 to 64 corresponding to the respective interior temperature sensors TC1 to TC4.

Depending on a kind of the heat processing apparatus, there is a case in which external temperature detectors, which correspond to the heaters 41 to 44 for the respective zones, are disposed outside the reaction vessel and temperature profiles are tuned based on the external temperature detectors. As has been described as the background art, there is a case, such as a maintenance operation, in which temperature detectors for profile are disposed near wafers in the respective zones. The objects to be tuned by the tuning condition setting part 81 are not limited to the interior temperature sensor TC1 to TC4, as in this embodiment, but the tuning condition setting part 81 can select a type of the temperature detector to be used.

A cascade method and a ratio-mix control method can be taken as examples as a tuning control mode.

Figure 3:
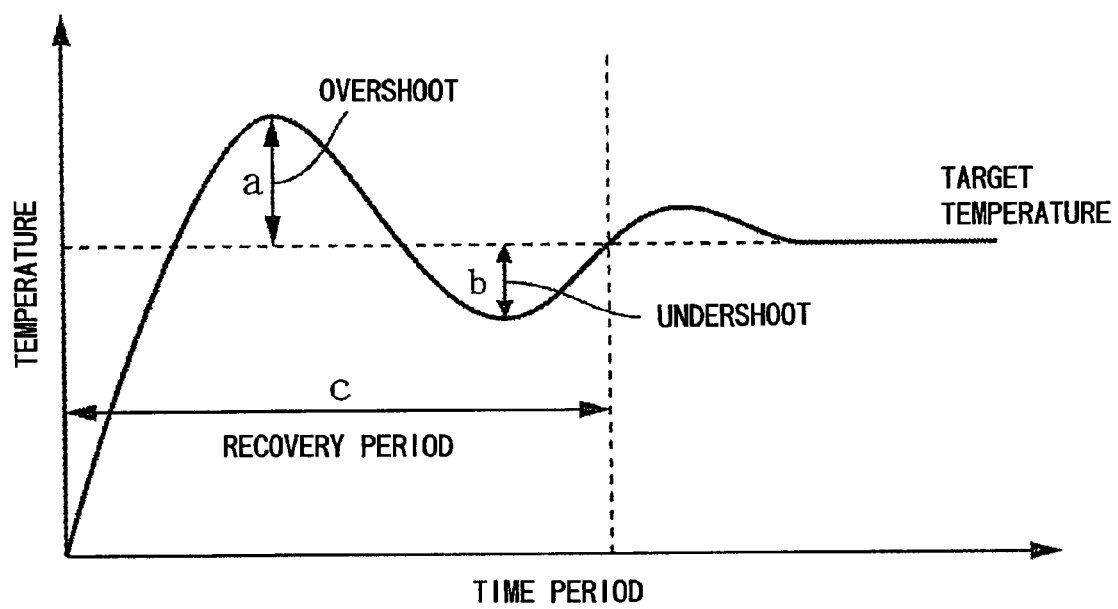
FIG. 3 is an explanatory view showing temperature property items to be analyzed.

Next, various temperature property items to be set by the tuning condition setting part 81 are described with reference to FIG. 3. FIG. 3 shows a result of temperature controls of the heaters 41 to 44 by using the temperature controllers 61 to 64 in this embodiment, i.e., FIG. 3 schematically shows a temperature profile (temperature transition data) in the reaction vessel 2 detected by the interior temperature sensors TC1 to TC4. A temperature (process temperature) in the reaction vessel 2 is controlled (PID-controlled) such that the temperature is increased from a preheat temperature up to a predetermined target value, for example, the temperature in the vessel (in-vessel temperature) is increased immediately after the start of the temperature control and exceeds the target value one time. Thereafter, the temperature repeatedly goes below and above the target value, so as to be gradually converged into the target value over time.

With respect to such a typical temperature profile, target values of the following four temperature property items are set in this embodiment. Namely, target values are set for (1) "overshoot" (corresponding to the temperature difference a in FIG. 3) which represents a maximum difference (absolute value) between the in-vessel temperature exceeding the target value and the target value, (2) "undershoot" (corresponding to the temperature difference b) which represents a maximum difference (absolute value) between the in-vessel temperature, which has gone beyond the target value one time and then fallen below the target value, and the target value, (3) "recovery period" (corresponding to the period c) which represents a time period while change of the in-vessel temperature is converged within a target temperature range (a preset temperature range in which the target value is a central value, e.g., a temperature range ±1° C. of the central value), and (4) "temperature difference between the zones" which represents a maximum temperature difference between the four divided zones. Based on the set target values, PID constants for each of the temperature controllers 61 to 64 can be automatically tuned.

When target values are set for the respective temperature property items, and PID constants are tuned based on the target values, there is a possibility that change ratios of the PID constants corresponding to predicted change amounts of the respective temperature property items conflict with each other, if optimum tuning results differ between the temperature property items. Thus, taking this case into consideration, the tuning condition setting part 81 can determine the priority order of the temperature property items. Namely, the tuning condition setting part 81 can determine which temperature priority item is preferentially tuned.

Returning to the explanation of the control part 7 shown in FIG. 2, after determining values of respective PID constants and performing a temperature-increase operation (RUN), the tuning program 83 is configured to make a temperature profile (temperature transition data) based on temperature values detected by the interior temperature sensors TC1 to TC4 during the temperature-increase operation, and to perform a series of processes for tuning the respective values of the PID constants with reference to a result obtained by analyzing the temperature profile and a rule table 84 which is described below.

As shown in FIGS. 4(a) to 4(c), the rule table 84 is a table in which predicted values of variation amounts of each temperature property item (predicted change amounts) and change ratios of each PID constant are correspondingly related to each other. The rule table 84 is prepared for each temperature property item. In addition, with respect to each temperature property item, the rule table 84 is provided for each process temperature band which is obtained by dividing the target values of the process temperature at every 100° C., for example. FIG. 4(a) shows a rule table 84a relating to the overshoot which is one the temperature property items. FIG. 4(b) shows a rule table 84b relating to the undershoot. FIG. 4(c) shows a rule table 84c relating to the recovery period.

A concrete example of the rule table 84a of the overshoot (process temperature band: 400° C.), which is one of the temperature property items, is described with reference to FIG. 4(a). The rule table 84a has five columns. When the leftmost column is referred to as the first column, there are described: in the first column, a process temperature band to which the rule table 84a is applied; in the second column, an predicted value of a variation amount of the overshoot; and in the third to fifth column, change ratios of PID constants corresponding to the predicted value described in the second column.

See, the third rows of the rule table 84a. When a change ratio of I is 0.55, a predicted value of a variation amount of the overshoot is 3° C. Namely, it is predicted that the overshoot is reduced by 3° C. Herein, the change ratio is a ratio for multiplying a predetermined standard value of a PID constant. For example, when a standard value of I is 1000, 1000 is multiplied by 0.55 to obtain the solution 550 which is used as a value of I in the PID calculation by the temperature controllers 61 to 64 at the next RUN.

The tuning program 83 further includes a program having a learning function. The program corrects the rule table 84 to more appropriate one, based on a result of a RUN which was performed with the use of the rule table 84. The learning function is briefly described. For example, a RUN is performed based on estimation that the overshoot is reduced by 3° C. in view the existing rule table 84a. However, the overshoot is actually reduced by 2° C. In this case, based on the actual RUN result, the estimation 3° C. described in the rule table 84a is changed into 2° C.

An actual RUN result often takes a value between the predicted values shown in FIG. 4(a). In this case, a predicted value to be changed may be interpolated based on the obtained RUN result, or may be corrected by a predetermined rule, which is described in the following description of the overall flow. In addition, the tuning program 83 has a function for independently performing tuning procedures of PID constants in accordance with various cases, based on a temperature profile obtained by a RUN.

In the claims, the performance unit corresponds to a part of the recipe execution program 82 and the tuning program 83, and the updating unit corresponds to a part of the tuning program 83.

Contents of an auto-tuning operation performed by the tuning program 83 are described below with reference to the flowchart shown in FIG. 5.

The auto-tuning of PID constants is performed, for example, when the apparatus is activated, after the apparatus is subjected to maintenance, and when a running of the vertical heat processing apparatus is started. Tuning conditions are set by the tuning condition setting part 81 (step S1).

When the tuning conditions are set, the interior temperature sensors TC1 to TC4 to be tuned at this time are selected. With respect to each of the interior temperature sensors TC1 to TC4 (hereinafter also referred to as "system"), target values are set for all the four temperature property items, i.e., the overshoot, the undershoot, the recovery period, and the temperature difference between the zones. Further, the priority order between these temperature property items is determined. When setting the target values, allowable ranges thereof are also set. Hereinafter, a state in which a value of a certain temperature property item is within an allowable range of a certain target value is expressed as "to fall within a target value range".

After these values are set, dummy wafers are placed in the wafer boat 25, and a recipe is executed for increasing a temperature in the reaction vessel 2 from, e.g., 200° C. to 400° C., which is a target value, while an inert gas is supplied to flow in the reaction vessel 2, for example, so as to obtain a temperature profile of the temperature-increasing operation (step S2). In an actual heat process, wafers are loaded into the reaction vessel 2, and the temperature-increasing operation is operated after a temperature in the reaction vessel 2 is stabilized. Thereafter, the temperature is increased up to the process temperature (target temperature). Thus, when the temperature-increasing operation for auto-tuning is started, the temperature in the reaction vessel 2 has been already stable. At this time, temperatures of the respective zones are PID-controlled by the temperature controllers 61 to 64 respectively connected to the interior temperature sensors TC1 to TC4. The PID calculation is performed by using, as PID constants, the standard values (in the rule table 84a shown in FIG. 4, P is set at 1000, I is set at 1000, and D is set at 1000).

After a temperature profile of each zone is obtained, the respective temperature property items are analyzed based on the thus obtained temperature profile (step S3). Namely, the overshoot, the undershoot, and the recovery period are calculated from the temperature profile of each of the four systems. The temperature difference between the zones is obtained as follows. That is, temperatures of the four systems are taken as samples at every predetermined interval while the above recipe is being executed. The temperatures are compared to each other, and a temperature difference between the maximum temperature and the minimum temperature is calculated. A maximum value among these temperature differences of the temperature difference profiles is regarded as the temperature difference between the zones.

After the temperature property items are analyzed, it is confirmed whether the overshoot, the undershoot, and the recovery period (hereafter abbreviated to "overshoot and so on") of each of the four systems fall within the target value ranges or not (step S4). When actually measured values of the overshoot and so on of all the four systems fall within the target value ranges (step S4; Y), it is further confirmed whether the temperature difference between the zones falls within the target value range or not (step S6). When the temperature difference between the zones falls within the target value range (step S6; Y), since no tuning is required, the auto-tuning operation is finished without changing the standard values of the PID constants (END).

On other hand, when a certain one system cannot fall within a target value range of any one of the overshoot and so on (step S4; N), reset values of PID constants corresponding to the temperature property item over the target value range are calculated (step S5), and the reset result is reflected on the corresponding one of the temperature controllers 61 to 64 which cannot fall within the target value range (step S8).

After the reset of the PID constants to the temperature controllers 61 to 64 is finished, execution of the recipe and obtainment of temperature profiles (step S2), analyze of the temperature property items (step S3), and comparison of actually measured values of the overshoot and so on to the target values (step S4) are repeated, until actually measured values of the temperature property items of all the systems fall within the target value ranges (step S4; Y).

On the other hand, although actually measured values of the overshoot and so on fall within the target value ranges (step S4; Y), only the temperature difference between the zones does not fall within the target value range (step S6; N), reset values of the PID constants corresponding to the temperature difference between the zones are calculated (step S7), and the obtained result is reflected on the temperature controllers 61 to 64 over the target value (step S8). Similarly to the case where actually measured values of the overshoot and so on cannot fall within the target value ranges, re-obtainment of temperature profiles and analyze of the temperature property items (steps S2 to S4; Y, and S6) are repeated until the temperature difference between the zones falls within the target value range (step S6; Y).

In this manner, the tuning program 83 in this embodiment repeats the resetting of the PID constants with respect to the temperature controllers 61 to 64, until actually measured values of the temperature property items fall within the target value ranges. Hereinafter, there is described a method of calculating PID constants used for the resetting, which is classified into (A) a method of calculating PID constants coping with the overshoot and so on, and (B) a method of calculating PID constants coping with the temperature difference between the zones.

(A) Method of Calculating PID Constants Coping with Overshoot and so on

Figure 5:
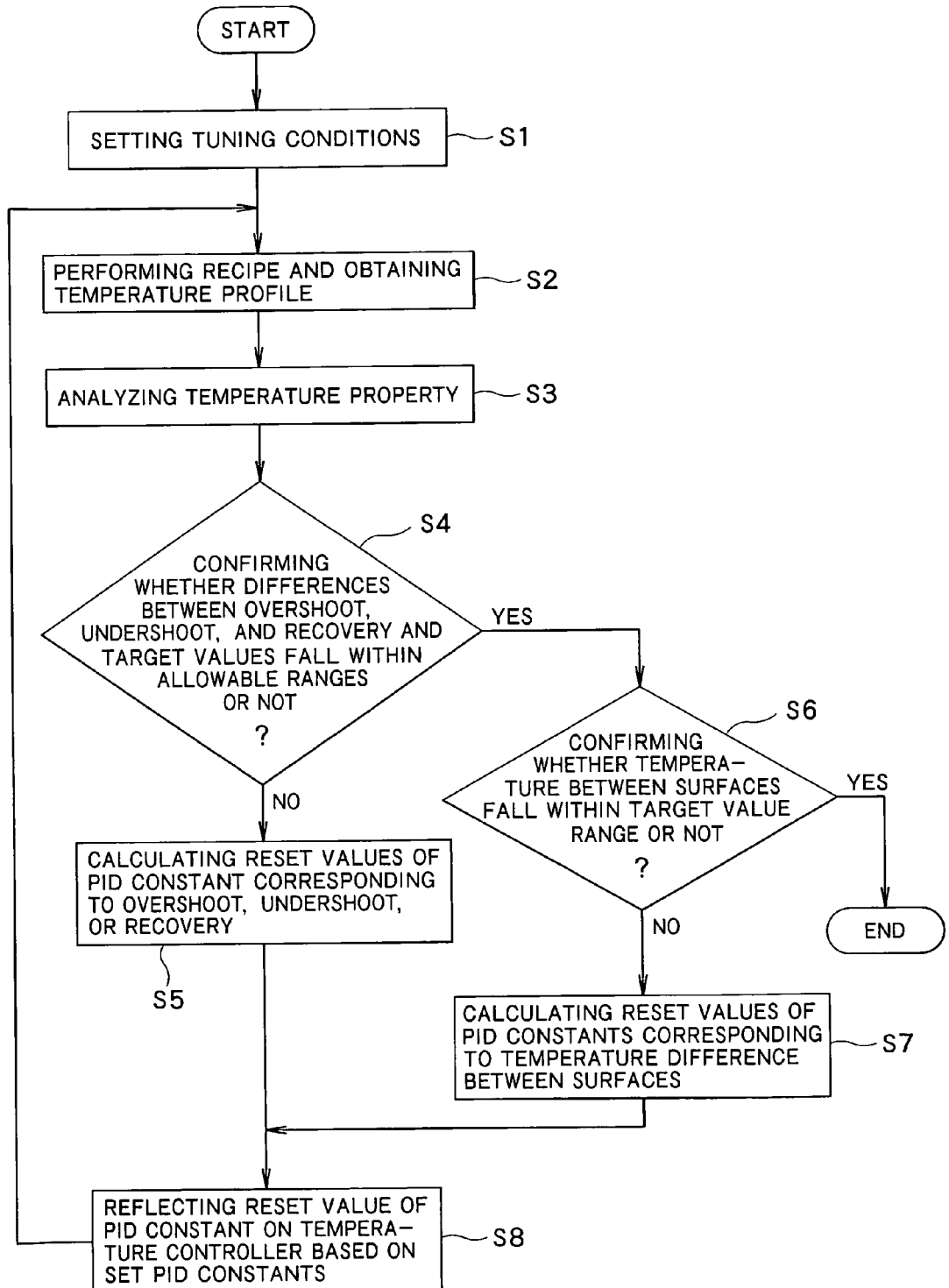
FIG. 5 is a flowchart showing a working flow of PID in one embodiment of the present invention.
Figure 6:
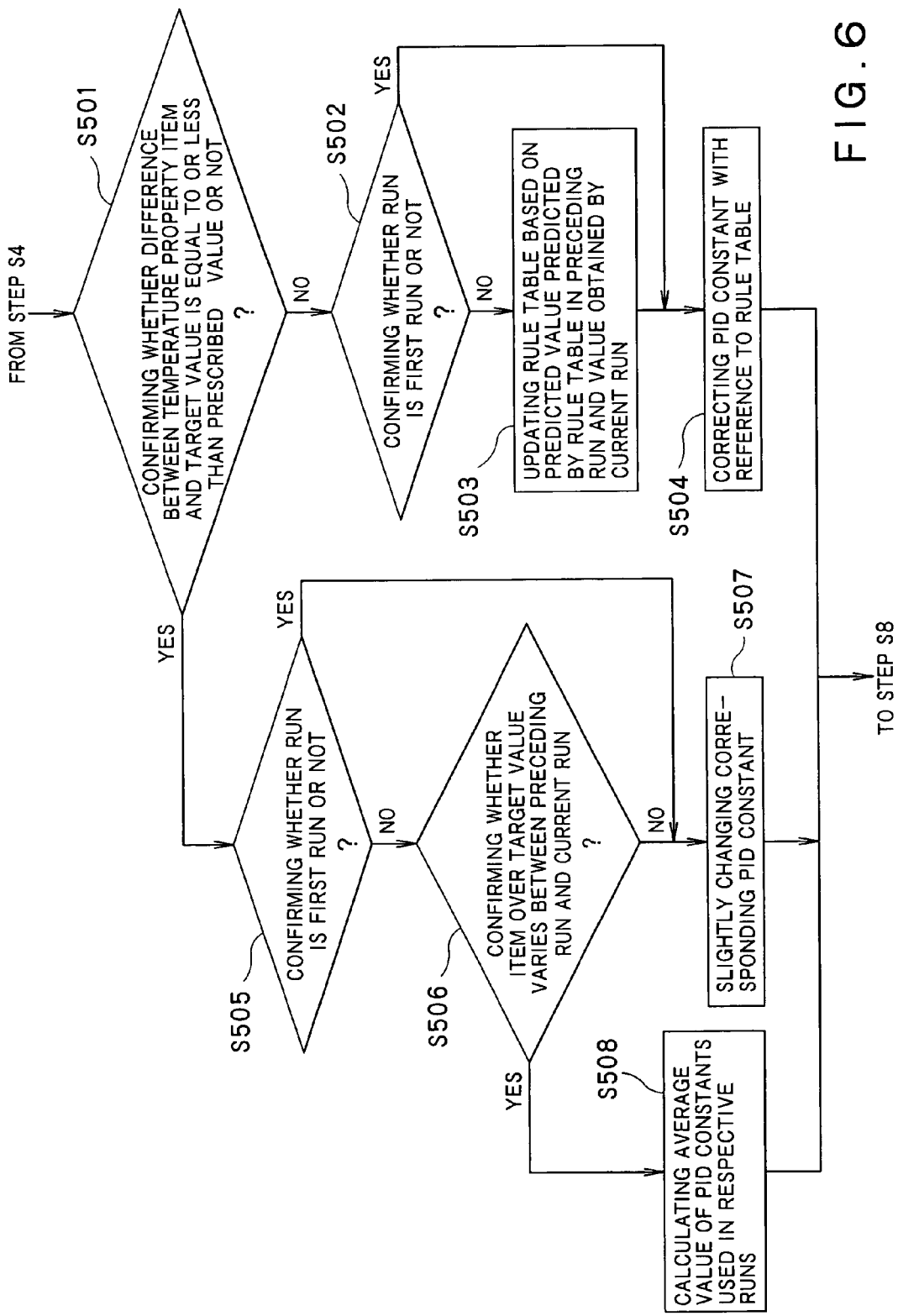
FIG. 6 is a flowchart showing a working flow of PID in one embodiment of the present invention.

FIG. 6 shows a flow of calculating PID constants coping with the overshoot and so on (corresponding to the step S5 in FIG. 5). As described above, in a case where there is a system whose actually measured value of any of the temperature property items such as overshoot and so on is over the target value, i.e., in a case where there is a system whose difference between the actually measured value and the target value is over the allowable range (step S4; N), it is judged whether the difference between the actually measured value over the target value of the temperature property item is equal to or smaller than a prescribed value or not (step S501).

The prescribed value herein is one of standards for determining which method is used out of the following three methods of calculating PID constants. The prescribed value is set at a value larger than the allowable range relative to the target value. When a difference between the actually measured value and the target value is larger than the prescribed value (step S501; N), it is necessary to drastically change the PID constants which have been used for obtaining the temperature profile, and PID constants are calculated with the use of the rule table 84 (steps S502 to S504). On the other hand, when the difference is equal to or smaller than the prescribed value (step S501; Y), it is not necessary to drastically change the PID constants. Thus, there is employed a method of calculating PID constants in which the PID constants are not so much changed (steps S505 to S508). These methods of calculating PID constants are sequentially described below with reference to the flowchart of FIG. 6 and the explanatory views of FIGS. 7 to 10.

At first, the calculating method using the rule table 84 is described. When the difference between the actually measured value of the temperature property item and the target value is larger than the prescribed value (step S501; N), it is confirmed whether the current RUN is the first RUN or not (step S502). When the current RUN is the first RUN whose PID constants should be corrected with the use of the rule table 84 (step S502; Y), the program proceeds to the step in which PID constants are calculated referring to the rule table 84 (step S504). On the other hand, when the current RUN is the second or succeeding RUN whose PID constants should be corrected with the sue of the rule table 84 (step S502; N), the learning function for updating the rule table 84 to more appropriate one is performed by using the temperature profiles obtained by the plurality of RUNs (step S503), and PID constants are calculated based on the updated rule table 84 (step S504).

At the calculation step of PID constants based on the rule table 84 (step S504), as has been described taking the overshoot as an example in FIG. 4(a), with respect to the temperature property item over the target value, a variation amount required to change the over value to the target value is specified. Then, the standard value of a PID constant is multiplied by a change ratio corresponding to the variation amount, and the thus obtained value is used as a corrected PID constant.

Figure 7:
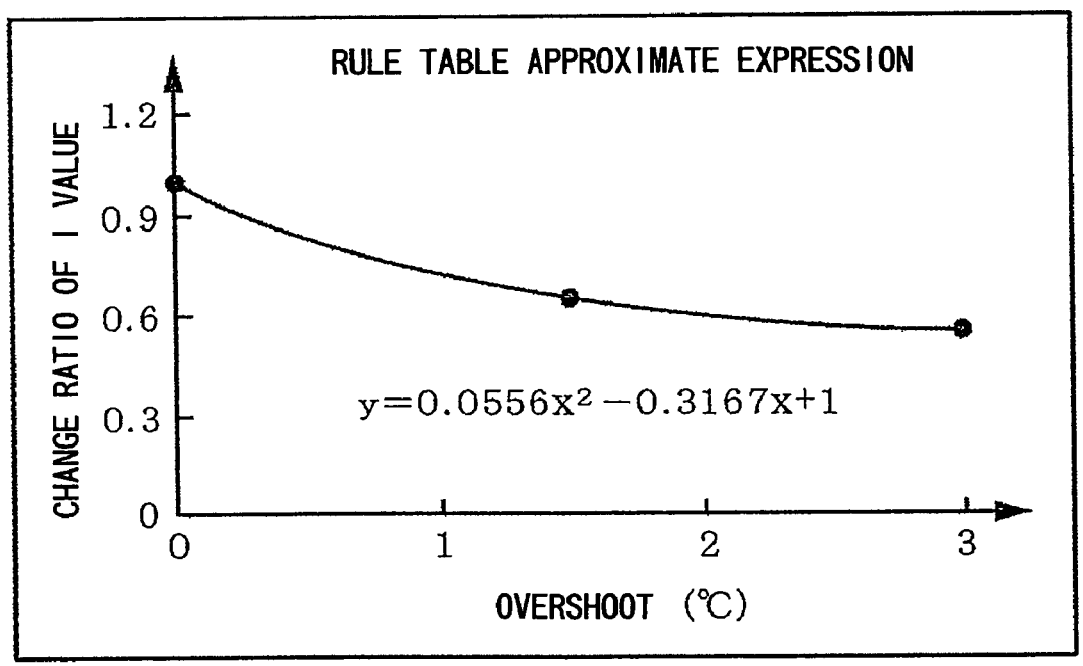
FIG. 7 is an explanatory view showing a method of calculating a PID constant when a difference between a temperature property and a target value is not less than a prescribed numerical value.
Figure 10:
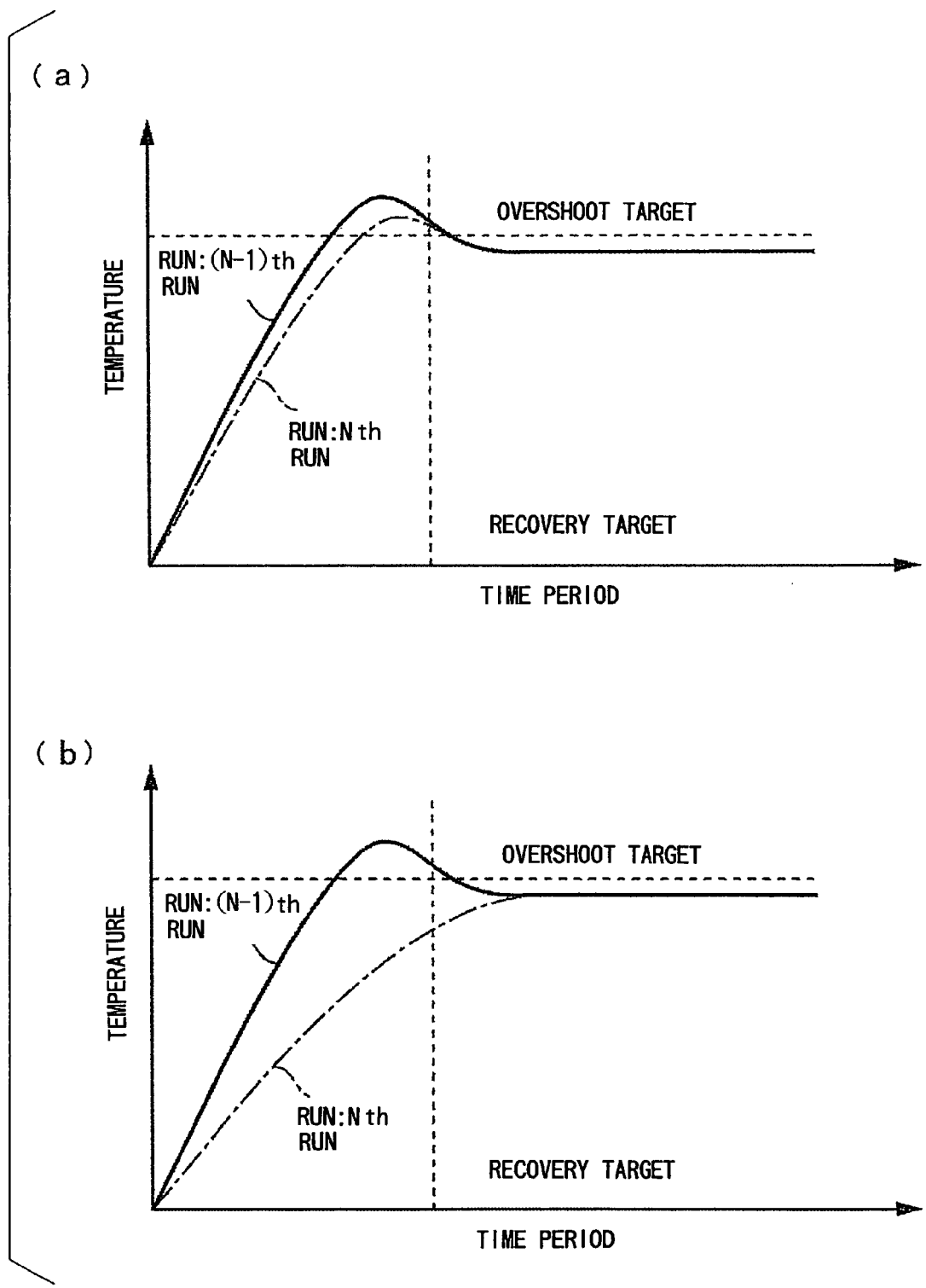
FIGS. 10(a) and 10(b) are explanatory views showing a method of calculating a PID constant when the difference between the temperature property and the target value is smaller than the prescribed numerical value.

FIG. 7 again shows the rule table 84a shown in FIG. 4(a). According to the rule table 84a, when a required change amount is 1.5° C. or 3° C., a change ratio described in the corresponding row is employed so as to calculate PID constants. On the other hand, when a required change amount does not correspond to these values, as shown in FIG. 7, an approximate expression is prepared by, e.g., a least-squares method, based on the three data described in the rule table 84a. By substituting the change amount to the approximate expression, a change ratio can be obtained.

In the example shown in FIG. 7, for example, an approximate expression for the temperature band of 400° C. which is obtained based on the rule table 84a is: $y=0.056x^2-0.3167x+1$ in which "x" represents a change amount of the overshoot and "y" represents a change ratio of I value.

In this case, suppose that a change ratio required for making the overshoot conform to the target value is 2° C., based on the temperature profile obtained by performing a certain RUN. Since the change amount of 2° C. does not correspond to any of the values 1.5° C. and 3° C., "x=2" is substituted in the above approximate expression to obtain "y=0.59" which is a new change ratio of I. Then, the thus obtained value 0.59 is reflected on the correction of the PID constants.

After reset values of PID constants are calculated based on the method as described above (step S504), the reset values are reflected on the temperature controllers 61 to 64, and a temperature profile is again obtained (FIG. 5, steps S8 to S3). In the second or succeeding RUN, when a value of the same temperature property item does not fall within the target value range (step S4; N in FIG. 5), and further the difference between the actually measured value of this temperature property item and the target value exceeds the prescribed value (Step S501; N, S502; N in FIG. 6), the learning function is performed by using the temperature profile obtained by this RUN (step S503).

Regarding the learning function, a procedure for changing the rule table 84a shown in FIG. 4(a) is described with reference to FIGS. 8 and 9. FIG. 8 shows a procedure for changing only a change amount described in the rule table 84a, while FIG. 9 shows a procedure for changing both a change amount and a change ratio corresponding thereto. Hereafter, the actually measured values of the overshoot and so on are merely taken as examples for convenience to explain a procedure for changing the rule table 84a. These values do not strictly represent values obtained when the operation shown in the flowchart of FIG. 6 is performed.

The case shown in FIG. 8 is firstly described. As described above, suppose that, when the first RUN is performed with the PID constants being set at the standard values, the overshoot is 3° C. In this case, since a change amount for making the overshoot correspond to the target value is 3° C., the change ratio 0.55 described in the third row in the table of FIG. 8(a) is selected.

After the I value of each of the temperature controllers 61 to 64 is reset based on the change ratio, the second RUN is performed. When there still exists the overshoot of 1° C., it can be understood that the change amount obtained by multiplying the I value by the change ratio of 0.55 was actually 2° C. Thus, in order to correct the rule table 84a to more appropriate one, as shown in FIG. 8(b), the change amount corresponding to the change ratio 0.55 is corrected to 2° C. When only a change amount is corrected, the learning function is performed by this procedure (step S503). Then, a new approximate expression is prepared based on the corrected rule table 84a, and the overshoot of 1° C. of the second RUN is inputted as the next change amount to the approximate expression. Then, based on the thus obtained change ratio, PID constants are calculated for performing the third RUN (step S504).

Next, the case shown in FIG. 9 is described. In FIG. 9(a), after the first RUN is performed and the overshoot is 3° C., 0.55 is selected as a change ratio of the I value, which is similar to FIG. 8(a). After the second RUN is performed with this change ratio, there still exists the overshoot of 2° C. In this case, it can be understood that the change amount obtained by multiplying the I value by the change ration of 0.55 was actually 1° C.

In this case, it is judged which row out of the rows in the rule table 84a in FIG. 9(a) is corrected. Out of the three points, i.e., 0° C., 1.5° C., and 3° C. described in the rule table 84a, the value most approximate to the change amount actually obtained by the second RUN is 1.5° C. described in the second row. Thus, the change amount described in the second row is corrected. In addition, since the change ratio of the I value described in the second column is 0.65, this value should be also corrected to 0.55. As a result, as shown in FIG. 9(b), two values of the change amount and the change ratio are corrected to the actually obtained values.

In this correction, as shown in FIG. 9(b), the change ratios of the I value described in the second row and the third become the same. In this case, since a one-to-one relationship between a predicted value of the change amount and a change ratio of the I value cannot be obtained, the third row should be also corrected. In this embodiment, the I value in the third row is corrected on the assumption that an inclination of change of the I value corresponding to a change of the change amounts obtained between the second row and the third row is not varied after this correction, and that the relationship therebetween is maintained (FIG. 9(c)). When both a change amount and a change ratio corresponding thereto are corrected, the learning function is performed by this procedure (step S503). Since the succeeding procedure of the step S504 for resetting PID constants based on the corrected rule table 84a is the same as that of the case shown in FIG. 8(a), a description thereof is omitted to avoid duplication.

Hereinbefore, there has been described the method of calculating PID constant by using the rule table 84a when the difference between the temperature property item and the target value is larger than the prescribed value (step S501; N). Next, a method of calculating PID constant when the above difference is equal to or smaller than the prescribed value (step S501; Y) with reference to the flowchart of FIG. 6 and FIG. 10.

In this case, following to the judgment (step S501; Y), it is confirmed whether the current RUN is the first RUN or not (step S505). When the current RUN is the first RUN whose PID constants should be finely tuned (step S505; Y), the corresponding PID constant is reduced by a slight amount. For example, the standard value 1000 of I is reduced by about 2% to 3% (step S507), and then the second RUN is performed based on the reset value.

On the other hand, when the current RUN is the second or succeeding RUN whose PID constants should be slightly tuned (step S505; N), it is judged whether the temperature property item which has been over the target value varies between the preceding RUN and the current RUN (step S506). When the temperature property item does not vary (step S506; N), the PID constant is similarly reduced by about 2% to 3% in addition to the previous change, and the next RUN is performed (step S507).

The fact that the temperature property item which has been over the target value does not vary means that, as shown in FIG. 10(a), the temperature property item (e.g., overshoot in FIG. 10(a)) in the temperature profile obtained by the current $n^{th}$ RUN is gradually improved as compared with the temperature profile obtained by the previous $(n-1)^{th}$ RUN. This slight tuning is continued at the next $(n+1)^{th}$ RUN, the temperature profile can be improved while avoiding a risk of changing the PID constant too much to disperse the tuning result.

On the other hand, when the temperature property item which has been over the target value is changed between the preceding RUN and the current RUN (step S506; Y), the next RUN is executed by using, as a reset value, an average value of the PID constants used in the preceding RUN and the current RUN (step S508).

The fact that the temperature property item which has been over the target value varies means that, as shown in FIG. 10(b), it is very likely that the temperature property item in the temperature profile obtained by the current ($n^{th}$ time) RUN is largely changed as compared with the temperature profile obtained by the previous $(n-1)^{th}$ RUN (in FIG. 10(b), although the overshoot is eliminated, a recovery period is elongated). Thus, the next $(n+1)^{th}$ RUN is performed by using, as a reset value, an average value of the PID constants used in the $n^{th}$ RUN and the $(n+1)^{th}$ RUN. Then, it is likely to obtain a temperature profile in which both the overshoot and the recovery period can take appropriate values.

In this manner, when the difference between the actually measured value of the temperature property item and the target value is over the allowable range and is larger than the prescribed value, the PID constants are changed with the use of the rule table 84. Meanwhile, the difference is equal to or smaller than the prescribed value, the PID constants are changed in the manner as described above, for example, without using the rule table 84. Therefore, it is possible to prevent that a change ratio of a PID constant is so large that an effect thereof is dispersed. It should be noted that the method of slightly tuning the PID constants is not limited to the above-described example.

Figure 11:
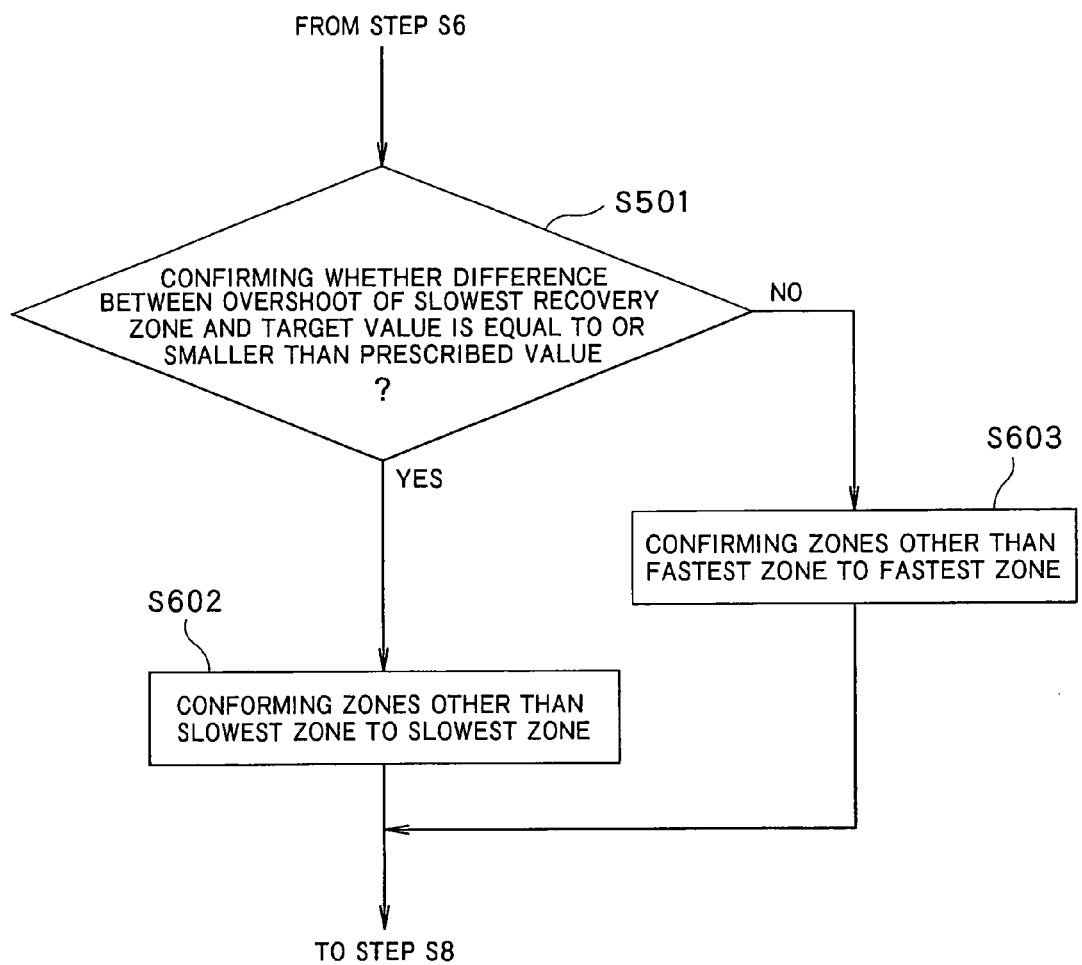
FIG. 11 is a flowchart showing a working flow of PID in one embodiment of the present invention.

(B) Calculation of PID Constants Coping with Temperature Difference Between Zones FIG. 11 shows an operation flow of calculating PID constants coping with the temperature difference between the zones (corresponding to step S7 in FIG. 5). As described above, only the temperature difference between the zones does not fall within the target value range (step S6; N) although actually measured values of the temperature property items such as overshoot and so on fall within the target value ranges (step S4; Y), the temperature profiles of the four zones are compared to each other. Then, it is confirmed that, regarding the temperature profile of the zone whose recovery period is slowest (hereinafter referred to as "slowest zone"), a difference between the overshoot and the target value is equal to or smaller than a second prescribed value (step S601).

Since the temperature property items such as the overshoot and so on have already fell within target value ranges by the preceding operations (namely, to achieve values smaller than the prescribed values used in the flowchart of FIG. 6), the second prescribed value is set smaller than an allowable error, for example. When the difference between the overshoot and the target value is equal to or smaller than the prescribed value (step S601; Y), reset values of PID constants are calculated (step S602) such that the recovery periods of the three zones other than the slowest zone conform to the recovery period of the slowest zone. To be specific, the rule tables 84c relating to the recovery period shown in FIG. 4(c) are prepared for the respective zones, for example, and P values for making slower the recovery periods are calculated by using these rule tables 84c. It is recommendable that calculation of the recovery period is performed by the same procedure as the procedure for calculating a reset value of the PID constant relating to the overshoot as described with reference to FIG. 7, for example.

Figure 12:
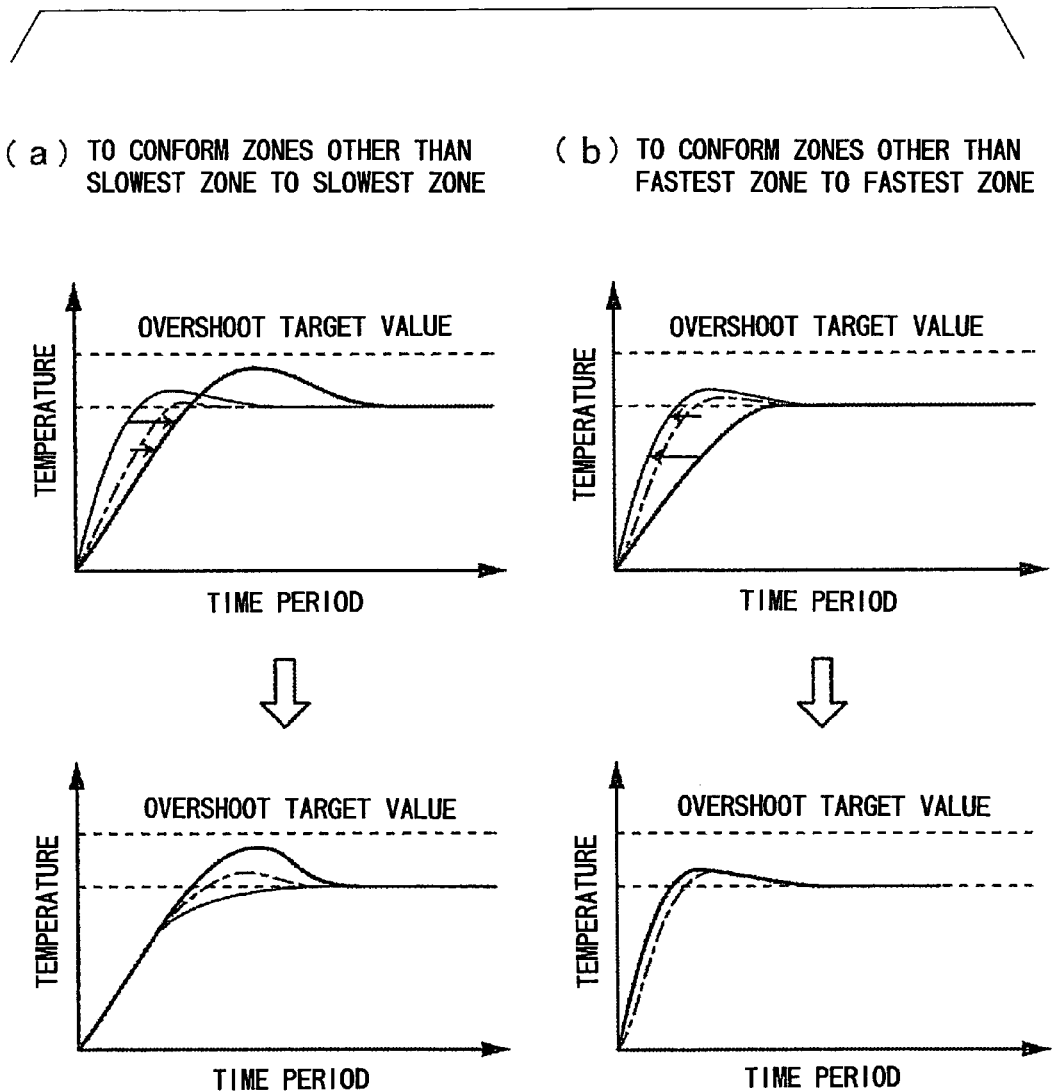
FIG. 12(a) is a view showing that zones other than a slowest zone are conformed to the slowest zone.
FIG. 12(b) is a view showing that zones other than a fastest zone are conformed to the fastest zone.

As a result, as schematically shown in FIG. 12(a), the dispersion in temperature profiles between the zones can be decreased without changing the PID constants of the slowest zone which is well tuned regarding the overshoot. In FIG. 12, only three temperature profiles between zones are shown for convenience of illustration.

On the other hand, when the PID constants are reset by using the rule tables 84c but the temperature difference between the zones does not fall within the target value range, the rule tables 84c are corrected to more appropriate one by the learning function, similarly to the case of the overshoot as has been described with reference to FIGS. 8 and 9. After that, PID constants are reset with the use of the corrected rule tables 84c, and the next RUN is performed. These operations are repeated until the temperature difference between the zones falls within the target value range.

On the other hand, when the difference between the overshoot in the temperature profile of the slowest zone and the target value is not equal to or smaller than the second prescribed value (step S601; N), PID constants are calculated such that the recovery periods of the three zones other than the fastest zone conform to the recovery period of the fastest zone (step S603), which is contrary to the step S602. In this case, it is also possible to use the rule table 84c so as to calculate PID constants. However, since a tuning direction of the change amount is a minus direction, by extrapolating an approximate expression of the rule table 84c to the minus direction of the recovery period, a change ratio for accelerating the recovery period can be specified.

Following thereto, when the overshoot of the slowest zone is not equal to or smaller than the second prescribed value, as shown in FIG. 12(b), even when the overshoot is controlled taking the recovery period, the tuning result of the overshoot cannot be improved any more. Thus, tuning is performed in which convergence of the temperature profiles is preferentially performed and dispersion in the temperature profiles between the zones is decreased. Also in this operation, if PID constants are reset by using the rule tables 84c but the temperature difference between the zones does not fall within the target value range, performance of the learning function for correcting the rule tables 84c to more appropriate one and resetting of the PID constants are repeated until the temperature difference between the zones can fall within the target value range.

In this manner, when the temperature profiles corresponding to the respective zones do not conform to each other, by tuning PID constants of zones other than one zone (fastest zone or slowest zone) such that the recovery periods of the other zones conform to the recovery period of the one zone, the temperature profiles between the zones can be made correspondent to each other. According to the above embodiment, after the PID constants are set, a temperature of the processing region is increased and a temperature profile is obtained. Then, when a difference between an actually measured value of the temperature property item and a target value is over an allowable range, PID constants are changed and reset based on a change ratio corresponding to an predicted change amount of the temperature property item relative to the difference, and thereafter the same steps are repeated until the difference falls within the allowable range. In addition, the rule table has the learning function so that a corresponding relationship between the PID constants in the rule table 84 and predicted change amounts of the temperature property item can be updated based on an actually measured change amount of the temperature property item which is actually measured after the use of the rule table 84. Thus, PID constants can be automatically set to be appropriate values in a reliable and easy manner. Further, due to the function for reducing the temperature difference between the zones, dispersion in processing of the substrates can be restrained, which results in improvement of throughput. Furthermore, since various tunings can be performed depending on a recipe for an auto-tuning and a type of temperature detector, it is possible to perform tuning suited for a user's need.

EXAMPLES

The experiments conducted for confirming the effect of the present invention are described below.

Example 1

By using the above-described vertical heat processing apparatus, the wafer boat 25 holding dummy wafers was loaded into the reaction vessel 2, with setting a temperature of the heater at 300° C. With the lapse of time after loading of the wafer boat 25 into the reaction vessel 2, the temperature in the reaction vessel 2 became stabilized. Thereafter, a set temperature of the heater was raised up to 800° C. An inside of the reaction vessel 2 was a depressurized atmosphere of an inert gas. FIG. 13(*a*) shows temperature profiles obtained by the respective interior temperature sensors TC1 to TC4 after the first RUN. FIG. 13(*b*) shows temperature profiles which were obtained when auto-tuning was performed until the third RUN based on the flowchart shown in FIG. 5. By comparing FIG. 13(*a*) with FIG. 13(*b*), it can be seen that, as the number of times of RUN increased, the overshoot of the uppermost interior temperature sensor TC1 could be decreased and dispersion in the temperature profiles between the temperature sensors TC1 to TC4 could also be decreased. That is to say, the excellent auto-tuning could be performed. Therefore, it can be understood that a temperature gradient in the process area in the reaction vessel 2 could be eliminated, whereby the temperature in the process area could be made uniform.

Example 2

Figure 14:
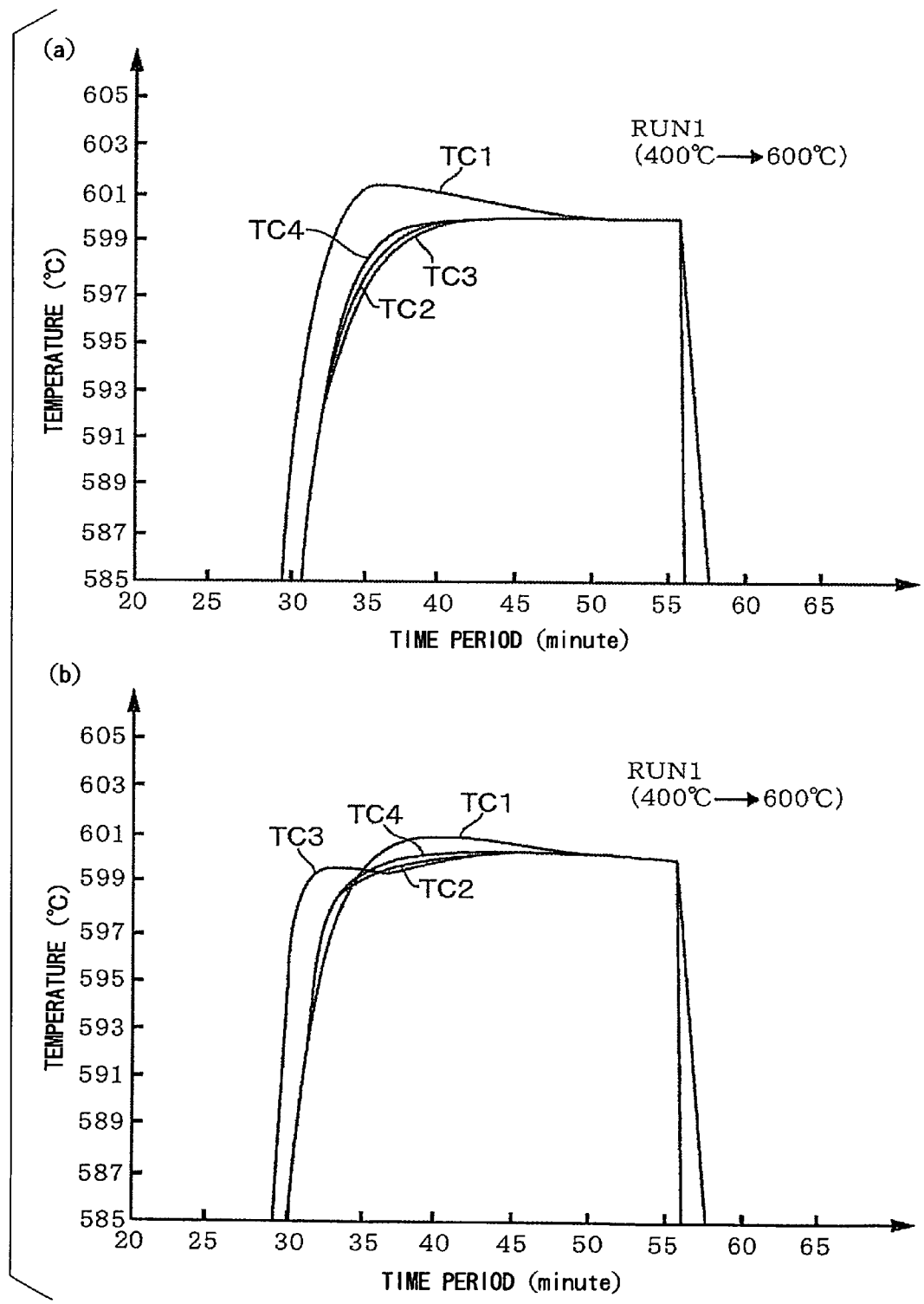
FIGS. 14(a) and 14(b) are explanatory views showing a temperature profile before and after performance of the tuning of the present invention.

A first RUN was performed under the same conditions as those of Example 1, other than a set temperature of the heater was 400° C. at the loading of the wafer boat 25 into the reaction vessel 2, and after the temperature in the reaction vessel 2 was stabilized, a set temperature of the heater was set up to 600° C. FIG. 14(*a*) shows temperature profiles obtained by the respective interior temperature sensors TC1 to TC4 after the first RUN was performed, and FIG. 14(*b*) shows the result after the fourth RUN was performed. By comparing FIG. 14(*a*) with FIG. 14(*b*), it can be seen that the overshoot amount of the uppermost interior temperature sensor TC1 after the first RUN could be decreased and dispersion in the temperature profiles between the zones could be also decreased.

Example 3

Figure 15:
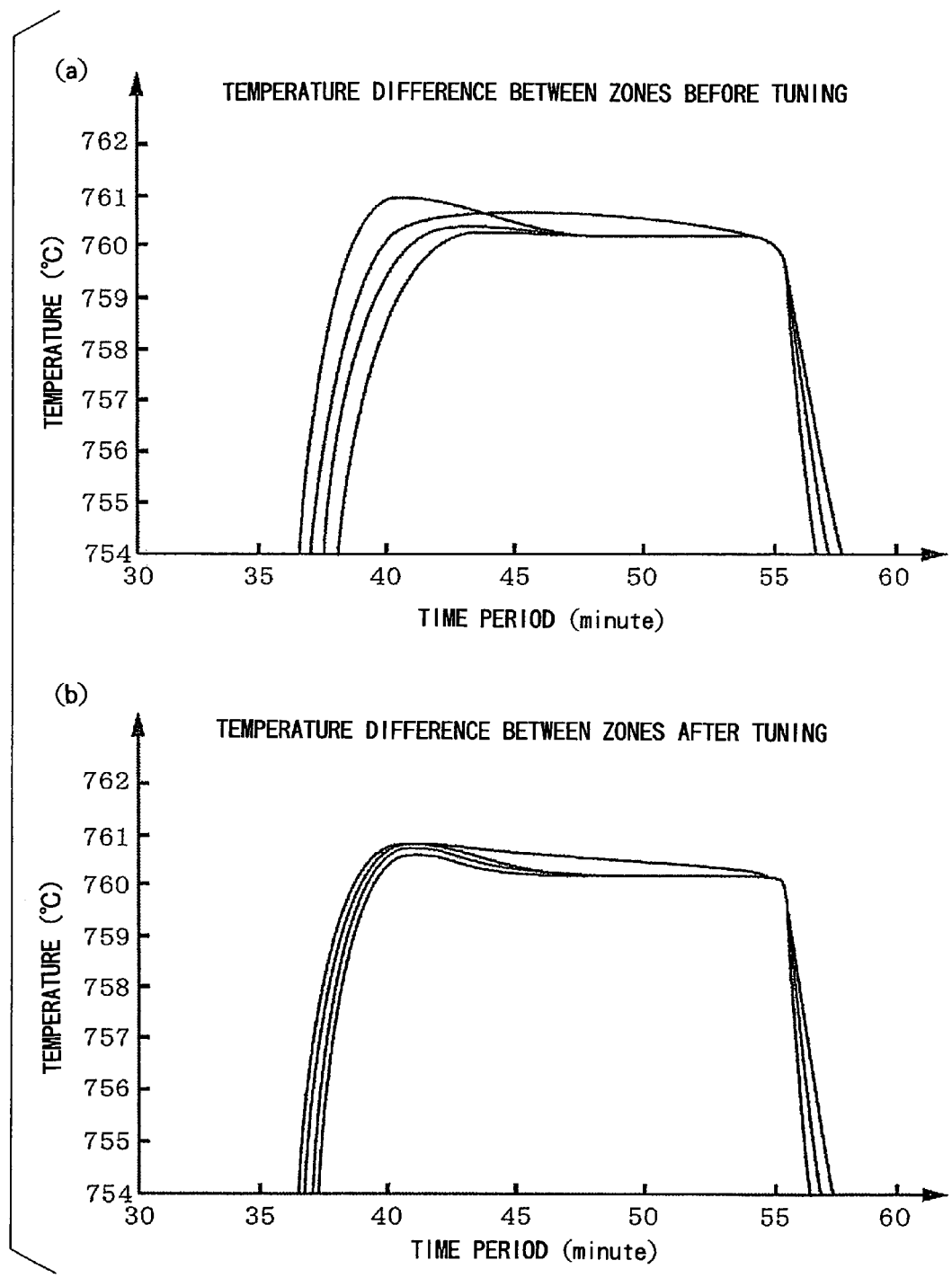
FIGS. 15(a) and 15(b) are explanatory views showing a temperature profile before and after performance of the tuning of the present invention.

A temperature of the heater was set at 400° C. at the loading of the wafer boat 25 into the reaction vessel 2, and after the temperature in the reaction vessel 2 was stabilized, a set temperature of the heater was set up to 760° C. Then, the auto-tuning was executed in the manner described in the embodiment. FIG. 15(*a*) shows an example of a temperature profile at this time in which the overshoot, the undershoot, and the recovery period converged with target values, while the temperature difference between the zones did not converge with a prescribed value range. FIG. 15(*b*) shows a temperature profile in which the temperature difference between the zones can fall within a prescribed value, after the tuning as show in FIG. 11 was performed. Also from this result, the inventors of the present invention believe that the steps shown in FIG. 11 are effective.

The invention claimed is:

1. A heat processing apparatus comprising:
   a reaction vessel configured to contain a processing region and an object to be processed;
   a heating unit disposed in the reaction vessel and configured to heat the processing region;
   a temperature detection part configured to detect a temperature of the processing region that is heated by the heating unit; and
   a control part configured to control the heating unit by a PID control;
   wherein the control part includes:
   a rule table that is prepared such that predicted change amounts of a temperature property item when a temperature of the processing region is increased up to a target value, and change ratios of PID constants are correspondingly related to each other;
   a performance unit configured to repeatedly perform: a step of, after setting the PID constants, obtaining a temperature profile based on a temperature detected value of the temperature detection part, while increasing the temperature of the processing region up to a target temperature by the heating unit, and calculating a difference between an actually measured value and a target value of the temperature property item based on the temperature profile; and a step of, when the difference is over an allowable range and larger than a prescribed value, referring to the rule table and changing the PID constants to reset new PID constants by a change ratio corresponding to an predicted change amount of the temperature property item relative to the difference; until the difference can fall within the allowable range; and
   an updating unit configured to update, when there is a difference between an actually measured change amount of the temperature property item that has been changed by changing the PID constants with reference to the rule table and a predicted change amount of the temperature property item that has been predicted in a preceding cycle, the corresponding relationship between the PID constants and the predicted change amounts of the temperature property item described in the rule table, based on the actually measured change amount.

2. The heat processing apparatus according to claim 1, wherein:
   the temperature property item includes a plurality of temperature property items; and
   the temperature property items are prioritized for a case in which the change ratios of the PID constants corresponding to the predicted change amounts of the respective temperature property items conflict with each other.

3. The heat processing apparatus according to claim 1, wherein
   the temperature property item is at least one of an overshoot that is a maximum difference between the temperature detected value of the temperature detection part exceeding the target temperature and the target temperature, an undershoot that is a maximum declining amount from the target temperature after the temperature detected value goes beyond the target temperature and then falls below the target temperature, and a temperature stability period that is a period from when the temperature increase is started until the temperature detected value converges with a predetermined temperature range.

4. The heat processing apparatus according to claim 1, wherein
when the difference between the actually measured value and the target value of the temperature property item is over the allowable range and is smaller than the prescribed value, the performance unit changes the PID constants without using the rule table.

5. The heat processing apparatus according to claim 4, wherein:
the temperature property item includes a plurality of temperature property items; and
in a case in which the temperature property item that has been over the target value does not vary between the preceding cycle and a current cycle, when the performance unit changes the PID constants without using the rule table, the performance unit changes the PID constants having an effect on this temperature property item by a preset change ratio.

6. The heat processing apparatus according to claim 4, wherein:
the temperature property item includes a plurality of temperature property items; and
in a case in which the temperature property item that has been over the target value varies between the preceding cycle and a current cycle, when the performance unit changes the PID constants without using the rule table, the performance unit uses an average value of the PID constants used in the preceding cycle and the current cycle as newly changed PID constants.

7. The heat processing apparatus according to claim 1, wherein:
the reaction vessel is divided into a plurality of divided regions;
the heating unit includes a plurality of heating units that are respectively disposed on the divided regions; and
each of the heating units is independently PID-controlled by the control part.

8. The heat processing apparatus according to claim 7, wherein
after the differences between the actually measured values of the temperature property items and the target values calculated based on temperature profiles corresponding to the respective divided regions fall within the allowable ranges, the performance unit judges whether the temperature profiles corresponding to the respective divided regions conform to each other or not, and if not, the performance unit tunes the PID constants corresponding to at least one divided region out of the plurality of divided regions based on a predetermined rule.

9. The heat processing apparatus according to claim 8, wherein:
the temperature property item of the rule table includes a temperature stability period that is a period from when the temperature increase is started until the temperature detected value converges with a predetermined temperature range; and
when the temperature profiles corresponding to the respective divided regions do not conform to each other, the performance unit tunes the PID constants corresponding to another divided region such that the temperature stability periods of the other divided region conforms to the temperature stability period of one divided region.

10. The heat processing apparatus according to claim 9, wherein:
the performance unit calculates a periodical difference between the temperature stability periods of the other divided region and the temperature stability period of the one divided region, and changes the PID constants to reset new PID constants for the other divided regions, with reference to the rule table, by a change ratio corresponding to an predicted change amount of the temperature stability period relative to the calculated periodical difference; and
the updating unit updates the rule table based on the changed PID constants.

11. An auto-tuning method of control constants, comprising:
a step of positioning an object to be processed in a processing region;
a step of thermally processing the object to be processed by a heating unit;
a step of controlling a temperature of the heating unit by a PID control;
a step (a) of detecting a temperature of the processing region that is heated by the heating unit;
a step (b) of repeating: a step (b1) of, after setting PID constants, obtaining a temperature profile based on a temperature detected value of a heat detection part, while increasing a temperature of the processing region up to a target temperature by the heating unit, and calculating a difference between an actually measured value and a target value based on the temperature profile; and a step (b2) of, when the difference is over an allowable range and larger than a prescribed value, referring to a rule table that is prepared such that predicted change amounts of a temperature property item when the temperature of the processing region is increased up to a target value, and change ratios of the PID constants are correspondingly related to each other, and changing the PID constants to reset new PID constants by a change ratio corresponding to an predicted change amount of the temperature property item relative to the difference; until the difference can fall within the allowable range; and
a step (c) of updating with reference to the rule table, when there is a difference between an actually measured change amount of the temperature property item that has been changed by the change of the PID constants and a predicted change amount of the temperature property item that has been predicted in a preceding cycle, the corresponding relationship between the PID constants and the predicted change amounts of the temperature property item described in the rule table, based on the actually measured change amount.

12. The auto-tuning method of control constants according to claim 11, wherein:
the temperature property item includes a plurality of temperature property items that are prioritized; and
when change ratios of the PID constants corresponding to predicted change amounts of the respective temperature property items conflict with each other, decision of which one of the temperature property items is preferentially tuned is made based on the prioritized order.

13. The auto-tuning method of control constants according to claim 11, wherein at least one of an overshoot that is a maximum difference between the temperature detected value of the temperature detection part exceeding the target temperature and the target temperature, an undershoot that is a maximum declining amount from the target temperature after the temperature detected value goes beyond the target temperature and then falls below the target temperature, and a temperature stability period that is a period from when the temperature increase is started until the temperature detected value converges with a predetermined temperature range, is used as the temperature property item.

14. The auto-tuning method of control constants according to claim 11, wherein
the step (b2) includes a step of changing the PID constants without using the rule table, when the difference between the actually measured value and the target value of the temperature property item is over the allowable range and is smaller than the prescribed value.

15. The auto-tuning method of control constants according to claim 14, wherein:
the temperature property item includes a plurality of temperature property items; and
the step of changing the PID constants without using the rule table changes, when the temperature property item that has been over the target value does not vary between the preceding cycle and a current cycle, the PID constants having an effect on this temperature property item by a preset change ratio.

16. The auto-tuning method of control constants according to claim 14, wherein:
the temperature property item includes a plurality of temperature property items; and
the step of changing the PID constants without using the rule table uses, when the temperature property item that has been over the target value varies between the preceding cycle and a current cycle, an average value of the PID constants used in the preceding cycle and the current cycle as newly changed PID constants.

17. The auto-tuning method of control constants according to claim 11; wherein
a reaction vessel is divided into a plurality of divided regions, and the heating unit includes a plurality of heating units that are respectively disposed on the divided regions; and
each of the heating units is independently PID-controlled.

18. The auto-tuning method of control constants according to claim 17, wherein
after the differences between the actually measured values of the temperature property items and the target values calculated based on temperature profiles corresponding to the respective divided regions fall within the allowable ranges, the step (b) judges whether the temperature profiles corresponding to the respective divided regions conform to each other or not, and if not, tunes the PID constants at least one divided region out of the plurality of divided regions based on a predetermined rule.

19. The auto-tuning method of control constants according to claim 18, wherein
the temperature property item of the rule table includes a temperature stability period that is a period from when the temperature increase is started until the temperature detected value converges with a predetermined temperature range; and when the temperature profiles corresponding to the respective divided regions do not conform to each other, the PID constants corresponding to another divided region such that the temperature stability periods of the other divided region conforms to the temperature stability period of one divided region.

20. The auto-tuning method of control constants according to claim 19, wherein
a periodical difference between the temperature stability periods of the other divided region and the temperature stability period of the one divided region is calculated, and the PID constants for the other divided regions are changed to be reset as new PID constants, with reference to the rule table, by a change ratio corresponding to an predicted change amount of the temperature stability period relative to the calculated periodical difference; and
the rule table is updated based on the changed PID constants by an updating unit.

21. A storage medium storing a computer program for causing a computer to perform an auto-tuning method of control constants, wherein
the auto-tuning method of control constants comprises:
a step of positioning an object to be processed in a processing region;
a step of thermally processing the object to be processed by a heating unit;
a step of controlling a temperature of the heating unit by a PID control;
a step (a) of detecting a temperature of the processing region that is heated by the heating unit;
a step (b) of repeating: a step (b1) of, after setting PID constants, obtaining a temperature profile based on a temperature detected value of a heat detection part, while increasing a temperature of the processing region up to a target temperature by the heating unit, and calculating a difference between an actually measured value and a target value based on the temperature profile; and a step (b2) of, when the difference is over an allowable range and larger than a prescribed value, referring to a rule table that is prepared such that predicted change amounts of a temperature property item when the temperature of the processing region is increased up to a target value, and change ratios of the PID constants are correspondingly related to each other, and changing the PID constants to reset new PID constants by a change ratio corresponding to a predicted change amount of the temperature property item relative to the difference; until the difference can fall within the allowable range; and
a step (c) of updating with reference to the rule table, when there is a difference between an actually measured change amount of the temperature property item that has been changed by the change of the PID constants and a predicted change amount of the temperature property item that has been predicted in a preceding cycle, the corresponding relationship between the PID constants and the predicted change amounts of the temperature property item described in the rule table, based on the actually measured change amount.

* * * * *